(12) United States Patent
Sun et al.

(10) Patent No.: US 9,134,186 B2
(45) Date of Patent: Sep. 15, 2015

(54) PROCESS CONDITION MEASURING DEVICE (PCMD) AND METHOD FOR MEASURING PROCESS CONDITIONS IN A WORKPIECE PROCESSING TOOL CONFIGURED TO PROCESS PRODUCTION WORKPIECES

(75) Inventors: Mei Sun, Los Altos, CA (US); Farhat Quli, Hayward, CA (US); Earl Jensen, Santa Clara, CA (US); Paul Arleo, San Francisco, CA (US); Vaibhaw Vishal, Fremont, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 748 days.

(21) Appl. No.: 13/020,770

(22) Filed: Feb. 3, 2011

(65) Prior Publication Data

US 2012/0203495 A1    Aug. 9, 2012

(51) Int. Cl.
G01K 17/00 (2006.01)
G01K 1/16 (2006.01)
H01L 21/67 (2006.01)

(52) U.S. Cl.
CPC .......... *G01K 17/00* (2013.01); *H01L 21/67248* (2013.01)

(58) Field of Classification Search
CPC ..... H01L 21/50; G03F 7/70875; G01K 17/00
USPC ..................................................... 438/5, 14
See application file for complete search history.

(56) References Cited

U.S. PATENT DOCUMENTS

| | | | | |
|---|---|---|---|---|
| 3,765,238 A | * | 10/1973 | Sumikama et al. | 374/30 |
| 4,198,859 A | * | 4/1980 | Holtermann | 374/30 |
| 4,333,803 A | * | 6/1982 | Seger et al. | 205/336 |
| 4,553,852 A | * | 11/1985 | Derderian et al. | 374/1 |
| 4,722,609 A | * | 2/1988 | Epstein et al. | 374/30 |
| 4,876,887 A | * | 10/1989 | Mickler | 73/204.11 |

(Continued)

FOREIGN PATENT DOCUMENTS

| | | | |
|---|---|---|---|
| CN | 101527274 A | * | 9/2009 |
| CN | 201477416 U | * | 5/2010 |

(Continued)

OTHER PUBLICATIONS

PCT International Search Report mail dated Aug. 29, 2012 for PCT International Application No. PCT/US2012/022352.

(Continued)

*Primary Examiner* — Gail Kaplan Verbitsky
(74) *Attorney, Agent, or Firm* — Joshua D. Isenberg; JDI Patent (57) ABSTRACT

A process condition measuring device (PCMD) may include first and second substrate components. One or more temperature sensors are embedded within each substrate component. The first and second substrate components are sandwiched together such that each temperature sensor in the second substrate component is aligned in tandem with a corresponding temperature sensor located in the first substrate component. Alternatively first and second temperature sensors may be positioned in parallel in the same substrate. Temperature differences may be measured between pairs of corresponding temperature sensors when the PCMD is subjected to process conditions in a workpiece processing tool. Process conditions in the tool may be calculated from the temperature differences.

52 Claims, 8 Drawing Sheets

(56) References Cited

U.S. PATENT DOCUMENTS

| | | | |
|---|---|---|---|
| 5,444,637 A | 8/1995 | Smesny et al. | |
| 5,488,350 A * | 1/1996 | Aslam et al. | 338/22 SD |
| 5,551,983 A | 9/1996 | Shepard, Jr. et al. | |
| 5,683,759 A | 11/1997 | Shepard, Jr. et al. | |
| 5,746,513 A | 5/1998 | Renken | |
| 5,884,235 A | 3/1999 | Ebert | |
| 5,969,639 A | 10/1999 | Lauf et al. | |
| 6,169,486 B1 | 1/2001 | Berkcan | |
| 6,278,051 B1 | 8/2001 | Peabody | |
| 6,325,536 B1 * | 12/2001 | Renken et al. | 374/161 |
| 6,494,090 B1 * | 12/2002 | Losing et al. | 73/204.26 |
| 6,542,835 B2 | 4/2003 | Mundt | |
| 6,561,796 B1 | 5/2003 | Barrera | |
| 6,579,731 B2 * | 6/2003 | Yun | 438/14 |
| 6,642,853 B2 | 11/2003 | Hunter | |
| 6,691,068 B1 | 2/2004 | Freed et al. | |
| 6,738,722 B2 | 5/2004 | Polla | |
| 6,741,945 B2 | 5/2004 | Polla | |
| 6,798,036 B2 | 9/2004 | Yun | |
| 6,907,364 B2 | 6/2005 | Poolla et al. | |
| 7,212,950 B2 | 5/2007 | Poolla | |
| 7,540,188 B2 * | 6/2009 | Wiese et al. | 73/431 |
| 7,580,767 B2 | 8/2009 | MacDonald et al. | |
| 7,699,520 B2 | 4/2010 | Yoo et al. | |
| 7,793,410 B2 * | 9/2010 | Padmanabhan et al. | 29/832 |
| 8,004,423 B2 * | 8/2011 | Mitchell et al. | 340/870.17 |
| 8,033,190 B2 * | 10/2011 | Renken et al. | 73/866.1 |
| 8,104,342 B2 * | 1/2012 | Sun et al. | 73/431 |
| 8,275,442 B2 * | 9/2012 | Allison | 600/407 |
| 8,519,866 B2 * | 8/2013 | Mitchell et al. | 340/870.01 |
| 2002/0189342 A1 * | 12/2002 | Ishiguro et al. | 73/204.26 |
| 2003/0029433 A1 * | 2/2003 | Hepworth | 125/23.02 |
| 2003/0142721 A1 * | 7/2003 | Hammer et al. | 374/29 |
| 2004/0101153 A1 * | 5/2004 | Grudin et al. | 381/357 |
| 2004/0107066 A1 * | 6/2004 | Poolla et al. | 702/136 |
| 2004/0154417 A1 * | 8/2004 | Renken et al. | 73/866.1 |
| 2005/0138991 A1 * | 6/2005 | Wallevik et al. | 73/54.02 |
| 2007/0237206 A1 * | 10/2007 | Kubota et al. | 374/164 |
| 2008/0097714 A1 * | 4/2008 | Somayaji et al. | 702/99 |
| 2009/0056441 A1 | 3/2009 | Sun et al. | |
| 2009/0219969 A1 * | 9/2009 | Yamamoto | 374/29 |
| 2010/0158069 A1 * | 6/2010 | Yoo et al. | 374/29 |
| 2011/0022215 A1 * | 1/2011 | Keil et al. | 700/110 |
| 2011/0133950 A1 * | 6/2011 | Subramanian et al. | 340/870.28 |
| 2012/0197597 A1 * | 8/2012 | Mitchell et al. | 702/188 |
| 2014/0284753 A1 * | 9/2014 | Ishitsuka et al. | 257/467 |
| 2014/0355643 A1 * | 12/2014 | Sharratt et al. | 374/1 |

FOREIGN PATENT DOCUMENTS

| | | | |
|---|---|---|---|
| EP | 908713 A1 * | 4/1999 | |
| JP | 2759116 B2 | 5/1998 | |
| JP | 2002170775 A | 6/2002 | |
| JP | 2005337750 A * | 12/2005 | |
| JP | 2009025098 A * | 2/2009 | |
| JP | 2009212199 A | 9/2009 | |
| KR | 20020079126 A | 10/2002 | |

OTHER PUBLICATIONS

Mason Freed et al., "Wafer-Grown Heat Flux Sensor Arrays for Plasma Etch Processes", from IEEE Transactions on Semiconductor Manufacturing, vol. 18, No. 1, Feb. 2005, pp. 148-162.

Roman V. Lobach et al, "The Case Development of a Heat Flux Sensor" from 8th International Siberian Workshop and Tutorials EDM'2007, Session II, Jul. 1-5, ERLAGOL, pp. 113-114.

V.Székely et al., "Design of a static TIM tester" from THERMINIC 2008, Sep. 24-26, 2008, Rome, Italy.

Sander van Herwaarden, "Thermal Conductivity Gauge XEN-TCG3880 for gas type measurement and vacuum measurement", Xensor Integration bv, Oct. 12, 2010, pp. 1-22.

Taiwanese Office Action for TW Application No. 101103555, dated Mar. 7, 2014.

\* cited by examiner

INSTRUCTIONS FOR DETERMINING PROCESS CONDITIONS FOR A WORKPIECE PROCESSING TOOL

CALCULATING HEAT FLUX VALUES
INSTRUCTIONS
703

DETERMINING PROCESS CONDITION
INSTRUCTIONS
705

PROCESS CONDITION MEASURING DEVICE (PCMD) AND METHOD FOR MEASURING PROCESS CONDITIONS IN A WORKPIECE PROCESSING TOOL CONFIGURED TO PROCESS PRODUCTION WORKPIECES

FIELD OF THE INVENTION

Embodiments of the present invention are related to a process condition measuring device (PCMD) for measuring process conditions in a workpiece processing tool configured to process production workpieces.

BACKGROUND OF THE INVENTION

During semiconductor fabrication (i.e., the process of creating integrated circuits on a silicon wafer for use in electronic devices), or more generally workpiece processing (e.g., flat panel display processing, lithography mask processing, etc.) a given substrate (e.g., silicon) may be exposed to a multitude of different sub-processes before the final product is completed. By way of example, and not by way of limitation, in the context of semiconductor fabrication, these sub-processes may include deposition, removal, patterning, and modification of electrical properties.

Deposition involves any process that grows, coats, or otherwise transfers a material onto the substrate. Several technologies exist for deposition depending on the nature of deposition desired. These technologies include physical vapor deposition (PVD), chemical vapor deposition (CVD), electrochemical deposition (ECD), molecular beam epitaxy (MBE), and atomic layer deposition (ALD). Removal involves any process that removes material from the wafer. Again, several technologies exist for removal depending on the type of removal desired (e.g., bulk, selective, etc.). These technologies include wet etching, dry etching, chemical-mechanical planarization (CMP) and plasma ashing. Finally, several different techniques exist for patterning (i.e., modifying the existing shape of deposited material) and modification of electrical properties and thermal properties (e.g., doping, annealing). Many of these sub-processes require the use of certain workpiece processing tools to facilitate performance.

To ensure effective design, process optimization, and fault detection of these workpiece processing tools, it is important to track certain characteristics and processing conditions associated with those tools. In particular, the heat flux developed through a substrate by a workpiece processing tool during operation may provide crucial information that aids in maintaining quality assurance and consistent controlled performance of the workpiece processing tool and very sub-process it is designed to serve. Moreover, measurement of localized spatial differences in heat flux as a function of time can provide means by which these workpiece processing tools and processes may be characterized independent of workpiece variability.

Currently, very few techniques exist for determining heat flux through a substrate. Those techniques that do exist possess limitations that make them impractical for use in particular workpiece processing tools. One technique uses the thermal decay rate of a temperature sensor to calculate heat flux. This technique is described, e.g., in commonly-assigned U.S. Pat. No. 6,907,364, which is incorporated herein by references. To employ this technique, a thermal stimulant is initially applied to a temperature sensor located on a substrate. The thermal stimulant is then turned off, and the temperature decay of the temperature sensor is measured, ultimately resulting in the determination of heat flux. This technique, however, is impractical for implementation with certain workpiece processes (e.g., standard wafer production processes). This is because continuous monitoring of the rate of change of heat flux cannot be realized using this technique and sporadic, transient monitoring may not supply the intended benefit.

A second technique involves embedding commercially available heat flux sensors in device substrates. However, these sensors are typically available only in large sizes (centimeters in length), and may not meet the dynamic range required for certain applications. The introduction of additional structures to the surface of a substrate during processing has the potential to cause severe disturbances in process conditions in a workpiece processing tool. Additionally, many of the materials used to construct these heat flux sensors may be incompatible with particular processing tools or processes. Thus, integrating these heat flux sensors into wafer like substrates for determining process conditions in a workpiece processing tool may be extremely challenging.

There is a need in the art for a technique capable of measuring heat flux through one or more locations of a substrate being processed by a workpiece processing tool configured to process production workpieces. It is within this context that embodiments of the present invention arise.

BRIEF DESCRIPTION OF THE DRAWINGS

Objects and advantages of embodiments of the invention will become apparent upon reading the following detailed description and upon reference to the accompanying drawings in which.

DESCRIPTION OF SPECIFIC EMBODIMENTS

As discussed above, there is a need in the art for a technique capable of measuring heat flux in one or more locations of a substrate being processed by a workpiece processing tool configured to process production workpieces. FIGS. 1A-1C, 2A-B, and 3A-3B are schematic diagrams illustrating process condition measuring devices (PCMDs) capable of measuring heat flux in accordance with preferred embodiments of the present invention.

Each PCMD includes one or more heat flux sensors configured to measure heat flux perpendicular to the PCMD at different locations of the PCMD. As used herein, a heat flux sensor refers to either a commercial heat flux sensor or a pair of temperature sensors aligned in a relationship configured to determine heat flux perpendicular to a PCMD by measuring a temperature difference between the two temperature sensors.

Figure 1A:
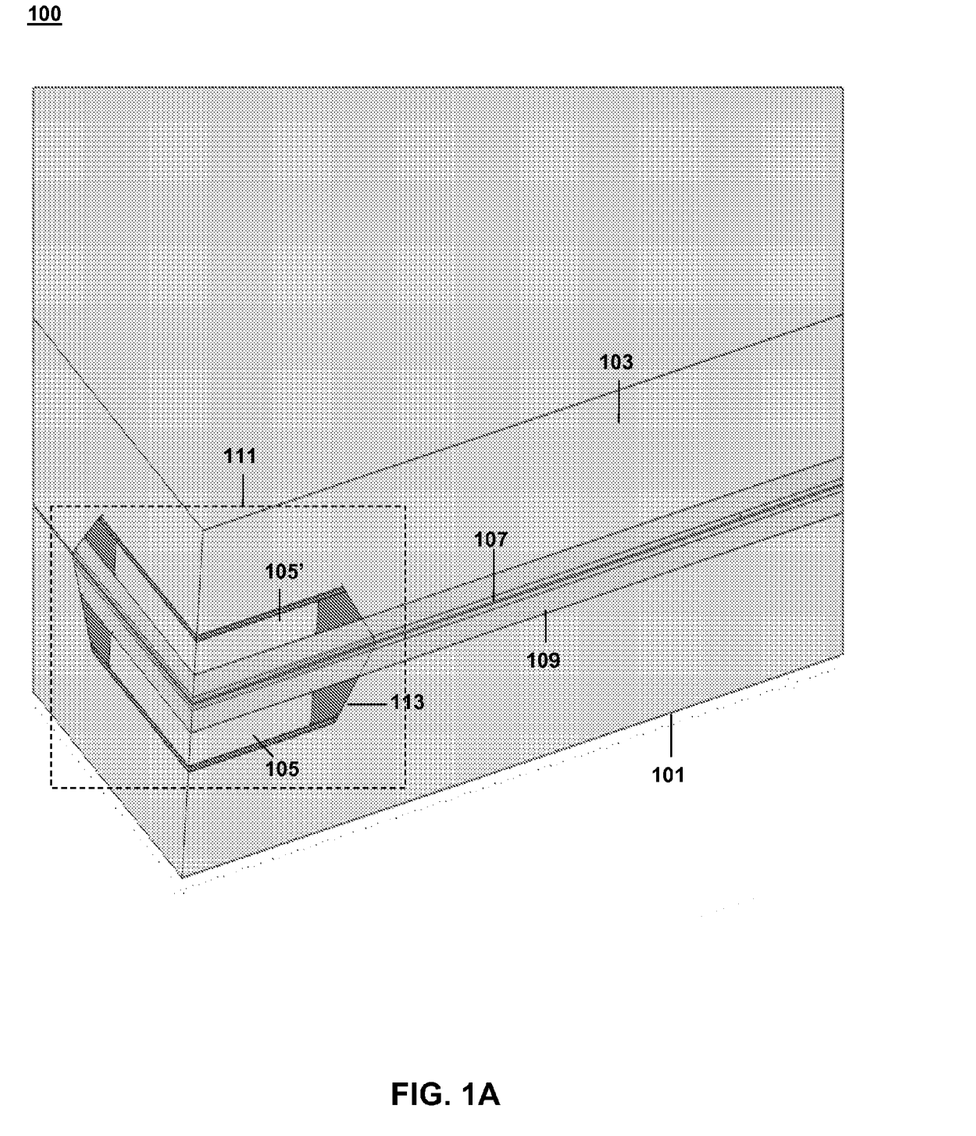
FIG. 1A is a three-dimensional cross-section of a processing condition measuring device (PCMD) according to an embodiment of the present invention.
Figure 1B:
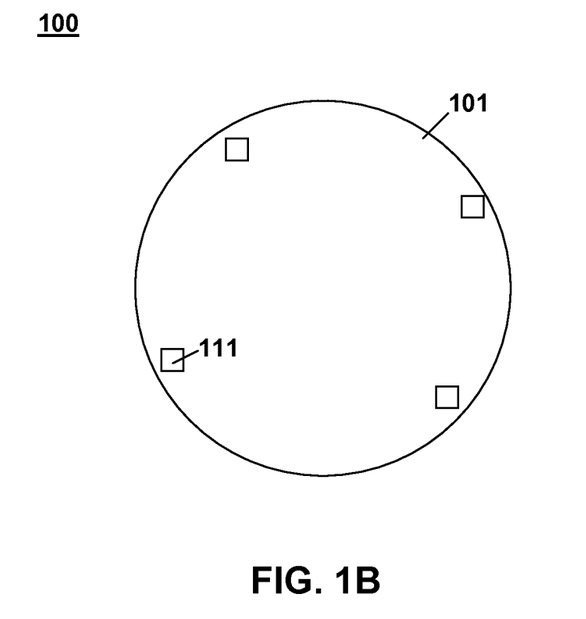
FIGS. 1B and 1C are top-views of a PCMD according to an embodiment of the present invention
Figure 1C:
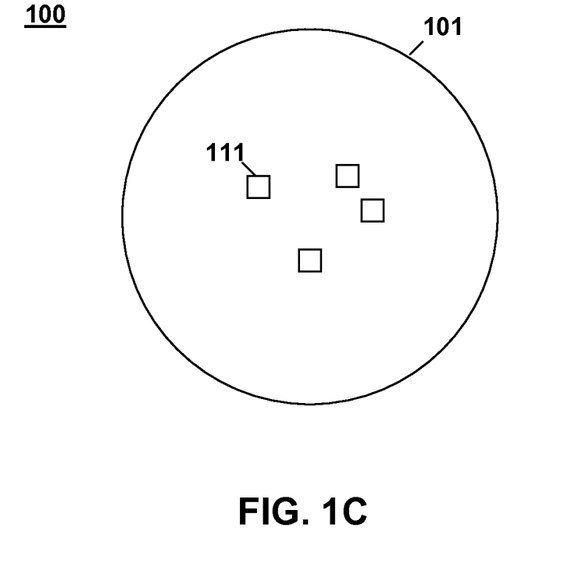

FIGS. 1A, 1B and 1C are schematic diagrams illustrating a PCMD capable of measuring heat flux in accordance with a preferred embodiment of the present invention. FIG. 1A is a three-dimensional cross-sectional view of such a PCMD 100. The PCMD 100 illustrated has a single heat flux sensor 111, however this device may be extended to include any number of heat flux sensors 111. The heat flux sensor 111 comprises a first temperature sensor 105 and a second temperature sensor 105', A substrate component 101 with the first temperature sensor 105 embedded within is sandwiched together with an additional substrate component 103 having the corresponding second temperature sensor 105' embedded within. Each temperature sensor 105, 105' may be embedded into a small cavity formed in a surface of its respective substrate component 101, 103 and secured in place, e.g., using thermal epoxy 113. In the embodiment depicted in FIG. 1A, the temperature sensors 105, 105' are sandwiched between the substrate component and additional substrate component such that they are protected from exposure to an environment within the workpiece processing tool by the substrate component 101 and the additional substrate component 103 during operation of the workpiece processing tool. This construction allows the PCMD 100 to measure process conditions in a processing tool while presenting a surface to the tool that is substantially the same as that of a standard workpiece processed by the tool. The temperature sensors 105, 105' do not protrude above the PCMD surface in such a construction.

The sensors 105, 105', substrate component 101, and additional substrate component 103 are positioned such that the first temperature sensor 105 in the substrate component 101 is aligned in tandem with a corresponding second temperature sensor 105' in the additional substrate 103 forming a heat flux sensor 111. As used herein, each pair of temperature sensors 105, 105' making up a heat flux sensor 111 is said to be "aligned in tandem" or "tandem aligned" when the temperature sensors are in an overlapping configuration, e.g., as shown in FIG. 1A. The centers of the two sensors may be in direct alignment or slightly offset depending on the process condition of the workpiece processing tool being determined. Dimension selection for placement and alignment of temperature sensors making up a heat flux sensor may be determined by calculation of thermal conduction (or thermal resistance) of material that separates a temperature sensor pair in light of an expected range of heat flux generated by the processing tool. By way of example, tandem aligned sensors may be located one on top of the other in a sandwich configuration such that centerlines of the individual sensors 105, 105' are normal to the surface of the substrate components 101, 103, e.g., as depicted in FIG. 1. Other orientations are implied as applications may emerge.

As illustrated, a single temperature sensor 105 in the substrate component 101 is paired with a single temperature sensor 105' in the additional substrate component 103 to form a single heat flux sensor 111 in the PCMD 100. However, it is important to note that the PCMD 100 may contain any number of heat flux sensors 111, which can be arranged in any desired pattern. Each temperature sensor 105 located within the PCMD 100 may be a resistance temperature detector (RTD), thermistor, thermocouple, or other suitable type sensor. By way of example, and not by way of limitation, each temperature sensor 105, 105' in the PCMD 100 may be 1-2 mm across. By way of example and not by way of limitation, the temperature sensors 105, 105' may be model LM20 surface mount device (SMD) temperature sensors commercially available from National Semiconductor of Santa Clara, Calif.

It is noted that it may be convenient and desirable to use two identical temperatures sensors 105, 105' (e.g., same model and manufacturer) in a heat flux sensor 111. However, this is not strictly necessary and it is possible for embodiments of the invention to use different models or even two completely different types of temperature sensors in forming a heat flux sensor 111 composed of tandem-aligned temperature sensors.

The substrate component 101 and additional substrate component 103 may be separated by an optional thermally resistive layer 107 that is sandwiched between them. The thermally resistive layer 107 can be an oxide, polyimide, silicone or some other dielectric material. There are a number of ways to form the thermally resistive layer 107. By way of example, and not by way of limitation, oxide may be implanted into a substrate component. Alternatively, oxide may be grown or deposited as by CVD (chemical vapor deposition) or PECVD (plasma enhanced chemical vapor deposition) on the surface of a substrate component. In addition, a polymer layer may be laminated between two substrate components.

Each substrate component 101, 103 of the PCMD 100 can be made of silicon, or any other material (e.g., sapphire, quartz, glass, silicon carbide, etc.) that is compatible with the processing conditions in the processing environment in which the PCMD 100 is intended to operate. The substrate components 101, 103 may also be made of a material that is substantially the same as a workpiece that is conventionally processed by the workpiece processing tool. "Substantially the same" means that the one material is chemically similar if not physically identical to another material. For example, materials can be substantially the same if both are made of single crystal silicon, but with different crystalline orientations. Alternatively, materials may be substantially the same if one is made of single crystal silicon and the other polycrystalline silicon. The term "substantially the same" also encompasses slight variations in the chemical composition of the two materials, e.g., due to different but otherwise acceptable levels of impurities.

Additionally, each substrate component 101, 103 may have a planar top surface that has substantially the same profile as a production workpiece that is processed by the workpiece processing tool—while one or other surface may have formed topography which resembles topography characteristics of a production workpiece. The PCMD 100 may also have substantially similar dimensions to a production workpiece that is processed by the workpiece processing tool to facilitate determination of workpiece process conditions. "Substantially similar" encompasses a PCMD wherein the top surface area and bottom surface area take on the exact dimensions of the production workpiece being processed by the workpiece processing tool, while the thickness of the PCMD is allowed to deviate substantially from the thickness of the production workpiece being processed by the workpiece processing tool. Design consideration may be given, however, to other characteristics of the workpiece handling mechanism of the workpiece processing tool, such as total allowable mass of the PCMD.

The PCMD 100 can provide a durable and non-contaminating surface presented to the workpiece processing tool. For example, if the workpiece processing tool is a process chamber configured to perform plasma processing (e.g., pattern-transfer or bulk etching or deposition) on silicon wafers, the PCMD 100 may be made of silicon so that the plasma "sees" a silicon surface. In other implementations, if it is desired to present a dielectric surface to the workpiece processing tool, a workpiece processing tool-compatible polymer coating, such as photoresist can cover the surface of the PCMD 100. Many workpiece processing tools are designed to process substrates that are covered with photoresist—for example plasma etch workpiece processing tools utilized in a pattern transfer mode. Consequently, the presence of photoresist on the surface of the PCMD 100 would not be expected to pose additional contamination hazards beyond those already taken into account in the design of the workpiece processing tool. Contamination of a workpiece processing tool resulting from exposure of the surface of the PCMD 100 during operation may be rectified and abated by whatever conventional process is used following normal treatment of production workpieces in the workpiece processing tool. By way of example, and not by way of limitation, after using the PCMD 100 to diagnose a plasma in a chamber used to etch a silicon substrate covered with a patterned photoresist, the chamber may be cleaned by a conventional process normally used to clean and re-condition such a chamber after such plasma etching. It is important to note that other dielectric materials may also be applied to the native silicon surface in addition to photoresist—some of which have already been implemented in embodiments of PCMDs of a related, but substantially independent nature.

The PCMD 100, as constructed in FIG. 1A is configured to facilitate determination of a heat flux at each location where there exists a heat flux sensor 111. Heat flux at each heat flux sensor location 111 may be calculated by measuring a temperature difference across a piece of material with known thermal resistance. For a given heat flux sensor 111 in the PCMD 100, a temperature is measured at the temperature sensor 105 in the substrate component 103 and an additional temperature is measured at the corresponding temperature sensor 105' in the additional substrate component 103. The difference between these two temperature measurements is then compared against the known and characterized thermal resistance that sits between the two temperature sensors 105, 105' to determine heat flux perpendicular to the PCMD 100 at the location of the heat flux sensor 111. A key parameter in determining the sensitivity of the PCMD is the thermal resistance between the two substrate components 101, 103 in the area surrounding the sensors 105. The PCMD 100 in this embodiment uses the dimensions and composition of the thermally resistive layer 107 to control the thermal resistance between the two substrate components 101, 103. Thus, the composition and thickness of the thermally resistive layer 107 can be adjusted to provide the required sensitivity and dynamic range for the heat flux measurement. By way of example, and not by way of limitation, the thermally resistive layer 107 may have a thickness between 5 µm and 1 mm.

Once heat flux has been determined by the PCMD, additional workpiece processing tool parameters may be characterized using the determined heat flux as a proxy. By way of example, and not by way of limitation, in a plasma etch chamber the energy and/or flux profile of energetic particles (e.g., ions, electrons, neutral atoms, or neutral molecules) bombarding the PCMD may be indirectly determined by calculating heat flux if particle energy and/or flux are believed to be substantially responsible as a source of heat flux in the plasma etch process. The varying of other "independent" etch tool parameters—such as pressure, flow, as well as physical and magnetic confinement parameters—can be easily shown to affect ion energy and ion flux distributions, profiles and time dependencies. In addition, rates of energetic reaction (e.g., recombination of electrons and ions) taking place at a surface of the PCMD may be indirectly determined from heat flux if such chemical reaction is believed to be substantially responsible as a source of heat flux in the plasmas process. Furthermore, a sink of deposited energy across the PCMD due to electrostatic clamping and active cooling may be determined indirectly from heat flux if such clamping or active cooling is believed to be substantially responsible as source of heat flux. Measurement of temperature differences and calculation of heat flux—as described here—can serve to parameterize these effects as well.

By way of example, and not by way of limitation, information captured by each temperature sensor 105, 105' within the PCMD 100 may be transmitted to an out-of-device processor for additional processing by way of a flex cable 109. Alternatively, the PCMD 100 may include a centralized processing unit (not shown in FIG. 1A) that is coupled to each of the sensors or sensor pairs shown. The centralized processing unit can provide a centralized component for transmitting and storing data from the sensors 105, 105' out of device to a remote receiver. The centralized processing unit can also provide a centralized component for receiving data from an external transmitter and relaying such data to one or more selected individual sensors 105, 105'. The centralized processing unit may include a wireless or wired transceiver unit that converts the data into signals that can be transmitted wirelessly, e.g., by electromagnetic induction or radiation. Alternatively, the electronics may transmit the signals over a medium, such as a flex cable or fiber optic link.

FIGS. 1B and 1C are top-view schematic diagrams of two alternative embodiments of the PCMD 100 described above with respect to FIG. 1A. In FIG. 1B, the heat flux sensors 111 are arranged around the outer edge of the substrate components. In FIG. 1C, the heat flux sensors 111 are arranged around the center of the substrate components. It is important to note that while the illustration depicts the heat flux sensors being located on the surface of the additional substrate component, in reality each temperature sensor associated with a heat flux sensor is embedded within its respective substrate component. Additionally, the substrate component lies directly beneath the additional substrate component 103, with the temperature sensors embedded within the additional substrate being aligned in tandem with the corresponding temperature sensors located within the substrate component, the two substrate components being bonded by a thermally resistive layer.

By modifying the location of heat flux sensors in the PCMD, the PCMD can be configured to measure heat flux perpendicular to the PCMD at different locations. Spatial variation of heat flux as a function of time, as determined by the PCMD, helps characterize and define certain parameters associated with the workpiece processing tool. By way of example, and not by way of limitation, spatial variation of heat flux in a plasma etch chamber may be used as a proxy for determining an ion energy distribution of ions striking the PCMD or an ion flux profile to the PCMD during operation of the workpiece processing tool. This is because the spatial variation of heat flux perpendicular to the PCMD is caused by energy source differences or energy sink differences. Thus, by capturing these differences with the PCMD (by capturing spatial variation of heat flux on the PCMD), we can determine ion energy and ion flux characteristics.

Figure 2A:
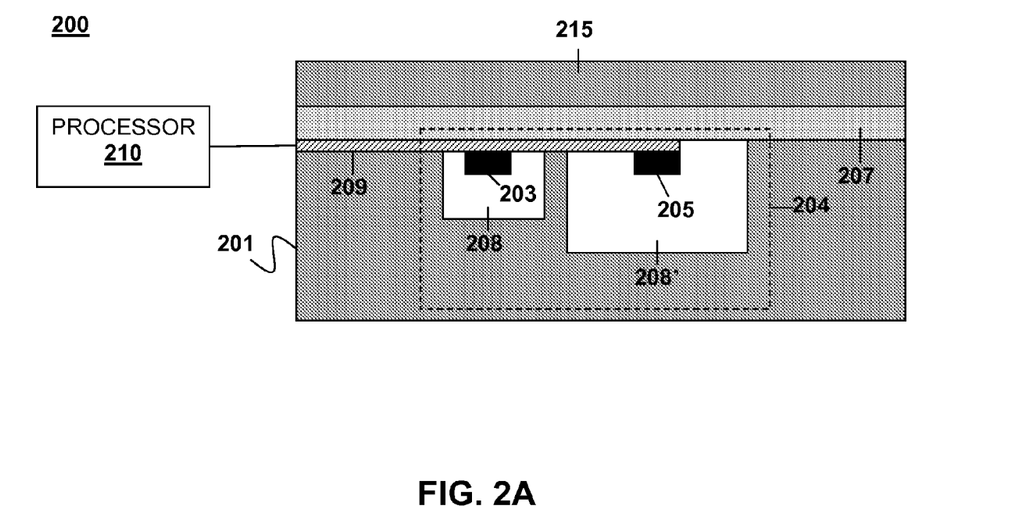
FIG. 2A is a cross-sectional schematic diagram of a PCMD according to an alternative embodiment of the present invention.

FIG. 2A is a cross-sectional schematic diagram illustrating a process condition measuring device (PCMD) capable of measuring heat flux in accordance with an alternative embodiment of the present invention. The PCMD 200 in this embodiment requires only a single substrate component 201. The PCMD 200 may have one or more heat flux sensors 204 embedded in the substrate component 201. For purposes of example, only a single heat flux sensor 204 is illustrated in the PCMD 200 in FIG. 2A. Each heat flux sensor 204 includes a first temperature sensor 203 embedded within a first thermally resistive cavity 208 in close proximity to a second temperature sensor 205 embedded within a second thermally resistive cavity 208'. The first thermally resistive cavity 208 and the second thermally resistive cavity 208' must have different thermal resistance values. This may be accomplished by using different areas for the thermally resistive cavities but the same thermally resistive material. Alternatively, the thermal resistance values of the thermally resistive cavities 208, 208' may also be different from each other if they have the same area by different material compositions or differing thermal resistivities. Of course, the thermal resistance may also be altered by using different materials and different sizes for the thermally resistive cavities 208, 208'.

The two temperature sensors 203, 205 are oriented in a parallel aligned relationship configured to determine a heat flux perpendicular to the substrate through measurement of a temperature difference between the two temperature sensors. The distance between the two temperature sensors depends on the characteristic variation length of the heat flux in a workpiece processing tool during operation. The two temperature sensors 203, 205 must be close enough together such that the imposed heat flux perpendicular to the PCMD does not vary between the locations of the two temperature sensors. A difference in measured temperature between the two temperature sensors during operation of the workpiece processing tool may then be determined. The difference may be attributed to the different thermal resistance values of the two thermally resistive cavities. This difference in measured temperature is then used to determine a heat flux value perpendicular to the PCMD, which may then be further used as a proxy for characterizing other parameters of the workpiece processing tool, as discussed above.

The substrate component 201 may also additionally be covered by an optional substrate component 215, which may sit directly above the substrate component 201. Alternatively, an optional thermal epoxy layer 207 may sit between the substrate component 201 and the optional substrate component 215. The purpose of the optional thermal epoxy layer 207 and the optional substrate component 215 is to shield the heat flux sensor 204 and its associated supporting electronics from exposure to an environment within the workpiece processing tool during operation.

Figure 2B:
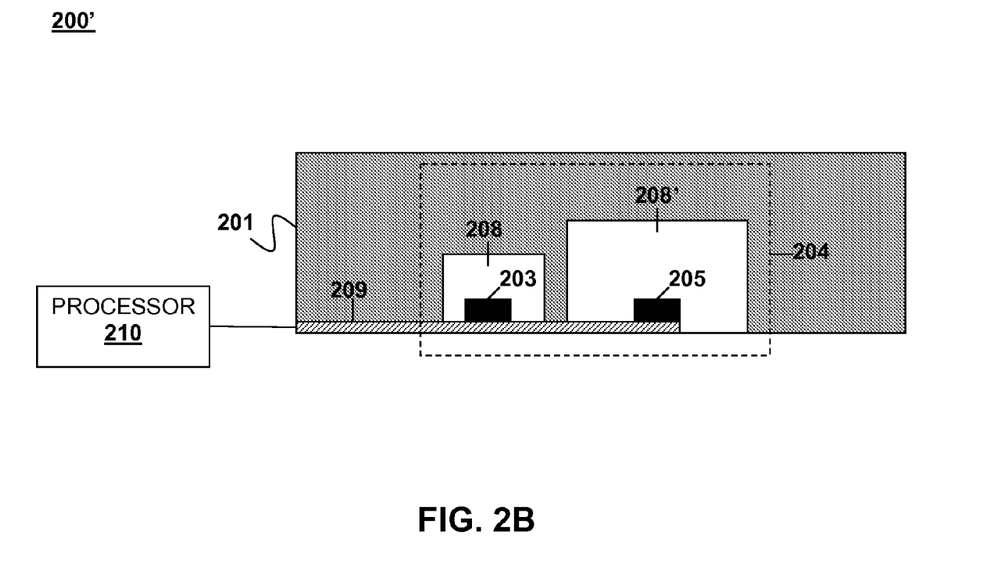
FIG. 2B is a cross-sectional schematic diagram of a PCMD according to an alternative embodiment of the present invention

The configuration of the PCMD in FIG. 2A may be modified, such that the heat flux sensor may be shielded from exposure to an environment within the workpiece processing tool during operation without the addition of an optional substrate component or optional thermal epoxy layer. FIG. 2B illustrates such a PCMD 200'. As illustrated the top surface and sidewalls of the heat flux sensor 204 are shielded from exposure to an environment within the workpiece processing tool during operation by the substrate component 201. The bottom surface of the heat flux sensor will presumably sit on a platform (e.g., wafer chuck) within the workpiece processing tool that will shield it from exposure to an environment of the workpiece processing tool during operation.

As mentioned above, the substrate component 201 of the PCMD 200, 200' can be made of silicon, or any other material (e.g., sapphire, quartz, glass, silicon carbide, etc.) that is compatible with the processing conditions in the processing environment in which the PCMD 200, 200' is intended to operate. Additionally, the substrate component 201 may have a planar top surface that has substantially the same profile and topographical features as a production workpiece that is processed by the workpiece processing tool. Also, the PCMD 200, 200' may have substantially similar dimensions to that of a production workpiece that is processed by the workpiece processing tool. Likewise, if it is desired to present a dielectric surface to the workpiece processing tool, a workpiece processing tool-compatible polymer coating, such as photoresist, polyimide, or an inorganic dielectric coating such as, but not limited to Y2O3 can cover the surface of the PCMD 200.

By way of example, and not by way of limitation, information captured by each temperature sensor within the PCMD 200, 200' may be transmitted to an out-of-device processor 210 for additional processing by way of a flex cable 209.

It is important to note that the PCMD depicted in FIG. 2A and FIG. 2B may modify the quantity and arrangement of heat flux sensors to measure heat flux perpendicular to the PCMD at different locations. Spatial variation of heat flux as a function of time, as determined by the PCMD, helps characterize and define certain parameters associated with the workpiece processing tool, as discussed above.

Figure 3A:
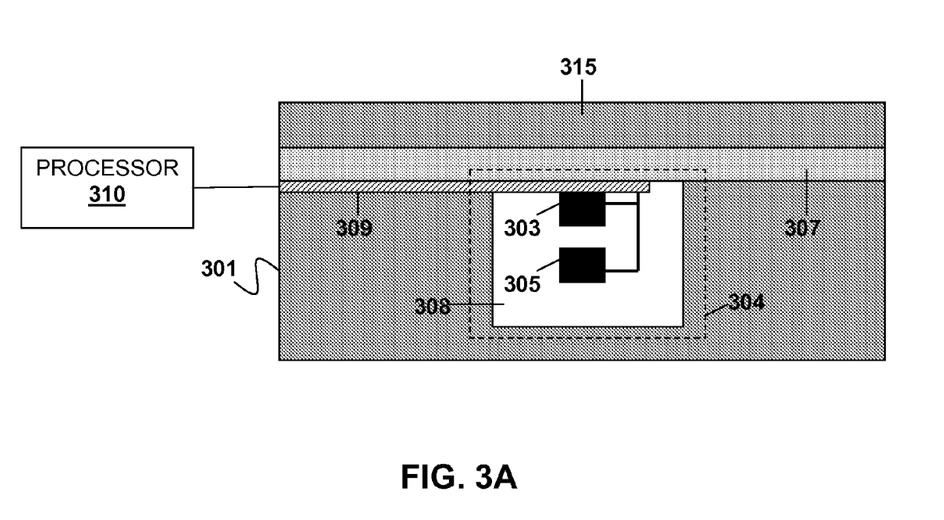
FIG. 3A is a cross-sectional schematic diagram of a PCMD according to an alternative embodiment of the present invention

FIG. 3A is a cross-sectional schematic diagram illustrating a process condition measuring device (PCMD) capable of measuring heat flux in accordance with yet another embodiment of the present invention. The PCMD 300 in this embodiment also requires only a single substrate component 301. The PCMD 300 may have one or more heat flux sensors 304 embedded in the substrate component 301. For purposes of example, only a single heat flux sensor 304 is illustrated in the PCMD 300 in FIG. 3A. Each heat flux sensor 304 includes a first temperature sensor 303 as well as a second temperature sensor 305 embedded within a single thermally resistive cavity 308, the two temperature sensors 303, 305 being aligned in tandem. The thermal resistance of the thermally resistive cavity 308 may be modified by altering the dimensions or composition of the thermally resistive cavity 308.

The two temperature sensors 303, 305 are aligned in tandem. Dimension selection for placement and alignment of temperature sensors making up a heat flux sensor is determined by calculation of thermal conduction (or thermal resistance) of material that separates a temperature sensor pair in light of an expected range of heat flux generated by the processing tool. Moreover, the thermally resistive cavity 308 may be designed to have overall thermal transfer characteristics (thermal conductivity and heat capacity) quite different from the overall thermal transfer characteristics of the surrounding substrate component 301.

Heat flux at each heat flux sensor location 304 may be calculated by measuring a temperature difference over a piece of material with known thermal resistance. For a given heat flux sensor 304 in the PCMD 300, a temperature is measured at the first temperature sensor 303 and an additional temperature is measured at the corresponding second temperature sensor 305. The difference between these two temperature measurements is then compared against the known thermal resistance that sits between the two temperature sensors 303, 305 to determine heat flux perpendicular to the PCMD 300 at the location of the heat flux sensor 304. A key parameter in determining the sensitivity of the PCMD 300 is the thermal resistance in the area surrounding the sensors 303, 305.

The substrate component 301 may also additionally be covered by an optional substrate component 315, which may sit directly above the substrate component 301. Alternatively, an optional thermal epoxy layer 307 may sit between the substrate component 301 and the optional substrate component 315. The purpose of the optional thermal epoxy layer 307 and the optional substrate component 315 is to shield the heat flux sensor 304 from exposure to an environment within the workpiece processing tool during operation.

Figure 3B:
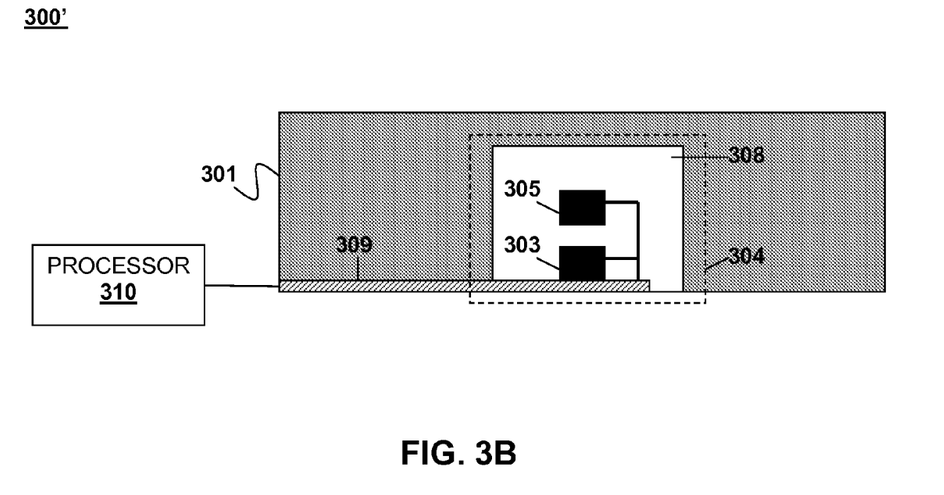
FIG. 3B is a cross-sectional schematic diagram of a PCMD according to an alternative embodiment of the present invention

The configuration of the PCMD in FIG. 3A may be modified, such that the heat flux sensor may be shielded from exposure to an environment within the workpiece processing tool during operation without the addition of a optional substrate component or optional thermal epoxy layer. FIG. 3B illustrates such a PCMD 300'. As illustrated the top surface and sidewalls of the heat flux sensor 304 are shielded from exposure to an environment within the workpiece processing tool during operation by the substrate component 301. The bottom surface of the heat flux sensor will presumably sit on a platform (e.g., wafer electrostatic chuck with active helium cooling) within the workpiece processing tool that will shield it from exposure to an environment of the workpiece processing tool during operation.

As mentioned above, the substrate component 301 of the PCMD 300, 300' can be made of silicon, or any other material (e.g., sapphire, quartz, glass, silicon carbide, etc.) that is compatible with the processing conditions in the processing environment in which the PCMD 300, 300' is intended to operate. Additionally, the substrate component 301 may have a planar top surface that has substantially the same profile as a production workpiece that is processed by the workpiece processing tool. Also, the PCMD 300, 300' may have substantially similar dimensions to that of a production workpiece that is processed by the workpiece processing tool. Likewise, if it is desired to present a dielectric surface to the workpiece processing tool, a workpiece processing tool-compatible polymer coating, such as photoresist, polyimide, or an inorganic dielectric coating such as, but not limited to Y2O3 can cover the surface of the PCMD 300.

By way of example, and not by way of limitation, information captured by each temperature sensor within the PCMD 300, 300' may be transmitted to an out-of-device processor 310 for additional processing by way of a flex cable 309.

It is important to note that in the PCMD depicted in FIG. 3A and FIG. 3B the quantity and arrangement of heat flux sensors may be modified to measure heat flux perpendicular to the PCMD at different locations. Spatial variation of heat flux as a function of time, as determined by the PCMD, helps characterize and define certain parameters associated with the workpiece processing tool, as discussed above.

It is noted that features of the PCMD depicted in FIG. 1 may be combined with features depicted in FIG. 2 or FIG. 3 and vice versa. In particular, embodiments of the present invention encompass a PCMD having one or more heat flux sensors comprising temperature sensors arranged in tandem alignment in different substrates sandwiched together, e.g., as shown in FIG. 1, one or more additional pairs of temperatures sensors in parallel alignment in the same substrate, e.g., as shown in FIG. 2, and one or more additional pairs of temperature sensors arranged in tandem alignment in the same substrate, e.g., as shown in FIG. 3. The tandem aligned pairs and parallel aligned pairs can both be used to determine heat flux perpendicular to the substrate.

Figure 4:
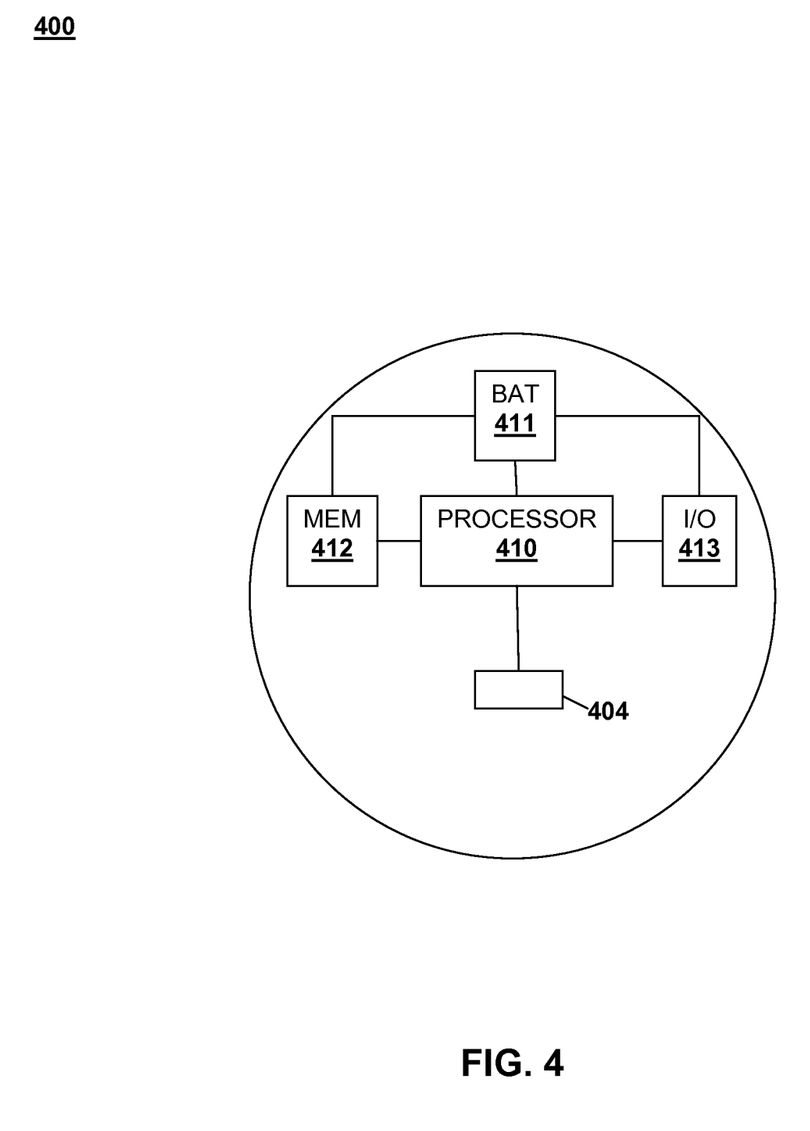
FIG. 4 is a top-view schematic diagram of a PCMD according to an embodiment of the present invention

Each PCMD described above with respect to FIGS. 1, 2 and 3 may optionally include electronic components configured to transmit/receive data associated with each heat flux sensor embedded therein. FIG. 4 illustrates an example of a general PCMD 400 (either the embodiment described in FIG. 1, 2, or 3) with such electronic components. In some embodiments, the PCMD 400 may include an on-board processor 410, power source 411 (e.g., a battery), memory 412 for storing data, and transceiver 413 for transmitting and receiving data and/or instructions. The transceiver 413 may communicate with a remote data processing system, e.g., by wireless or wired connection. The on-board processor 410 may be configured to communicate with the one or more heat flux sensors 404. Alternatively, the PCMD 400 may include a centralized processing unit (not shown in FIG. 4) that is coupled to each of the sensors shown as discussed above and configured transmit and receive data and/or instructions.

Figure 5:
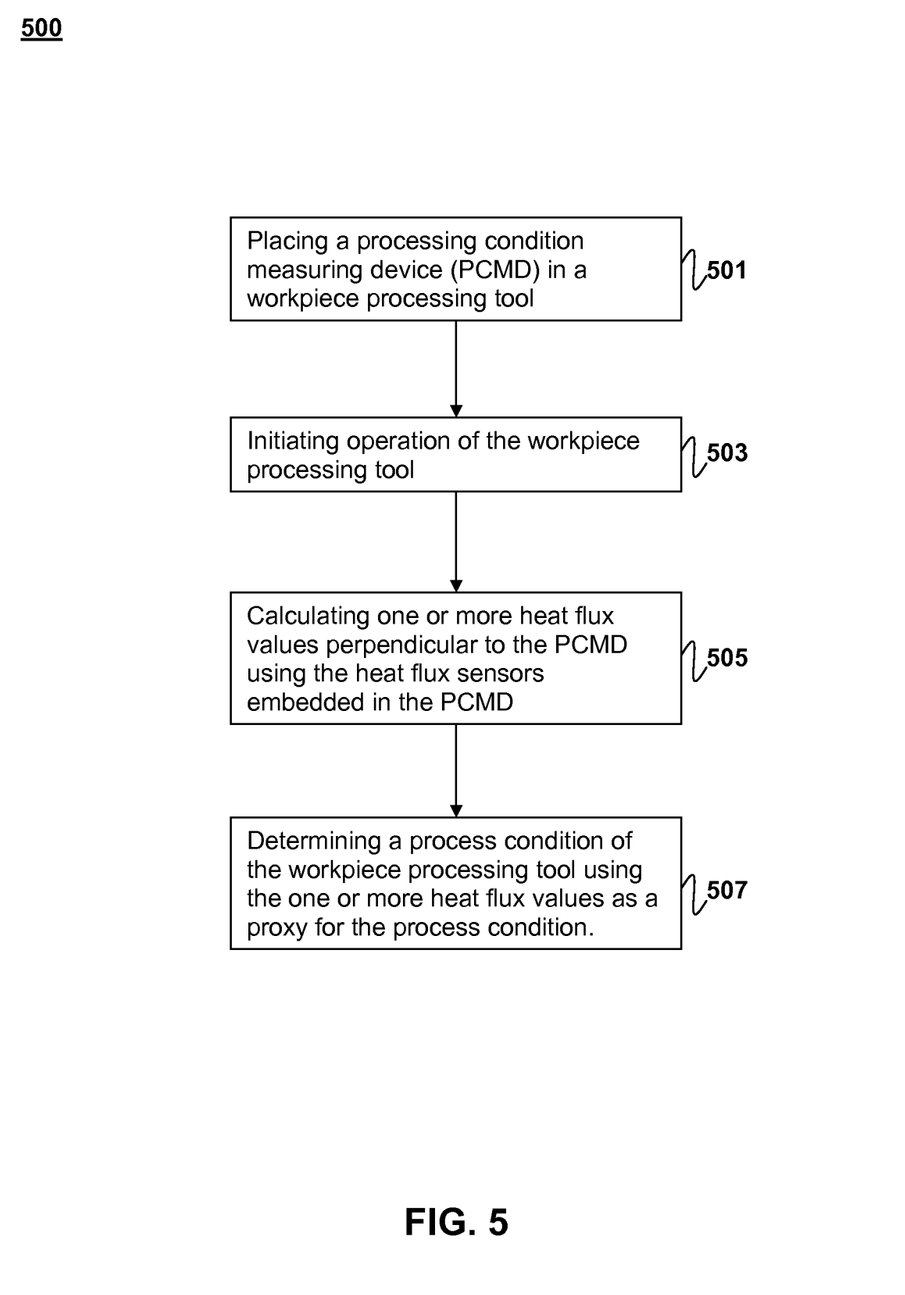
FIG. 5 is a flow diagram illustrating a method for determining process conditions of a workpiece processing tool according to an embodiment of the present invention.

FIG. 5 is a flow diagram illustrating a general method for determining process conditions in a workpiece processing tool configured to process production workpieces in accordance with an embodiment of the present invention. This method 500 for determining workpiece processing tool conditions is applicable to workpiece processing tools configured to perform any of the semiconductor fabrication processes or general workpiece processes mentioned above.

Initially a process condition measuring device (PCMD) is placed in a workpiece processing tool as described at 501. The PCMD may include a substrate component and one or more heat flux sensors embedded within the substrate. According to the embodiment described in FIG. 1, the PCMD may further comprise an additional substrate component sandwiched together with the substrate component, wherein the one or more heat flux sensors are embedded between the substrate component and the additional substrate component. Here, each heat flux sensor includes two temperature sensors, a first temperature sensor being embedded within the substrate component and a second temperature sensor being embedded within the additional substrate component, the first and second temperature sensors being aligned in tandem.

Alternatively, the PCMD may be configured according to the embodiment described in FIG. 2. Here, each heat flux sensor embedded within the substrate component includes two temperature sensors in close proximity, a first temperature sensor being embedded within a first thermally resistive cavity of the substrate component and a second temperature sensor being embedded within a second thermally resistive cavity of the substrate component, the first thermally resistive cavity being a different size or different composition than the second thermally resistive cavity, and the first temperature sensor and second temperature sensor being aligned in a parallel relationship configured to facilitate determination of heat flux perpendicular to the substrate through measurement of a temperature difference between the two temperature sensors.

The PCMD may also be configured according to the embodiment described in FIG. 3. Here, each heat flux sensor embedded within the substrate component includes two temperature sensors embedded within a thermally resistive cavity of the substrate component, the two temperature sensors being aligned in tandem.

Once the PCMD has been placed in the workpiece processing tool, the tool may initiate operation as described at 503. Operation may take on several different forms depending on the type of workpiece processing tool involved. In the context of semiconductor fabrication, operation may involve deposition (e.g., PVD, CVD, ECD, MBE, ALD), removal (e.g., wet etching, dry etching—pattern-transfer or bulk removal mode, plasma ashing), patterning, or modification of electrical properties. More generally, operation may involve processing of flat panel displays, lithography masks, or other electronic devices.

As the workpiece processing tool operates, the PCMD calculates one or more heat flux values perpendicular to the PCMD using the heat flux sensors embedded in the PCMD. These heat flux values may be taken at different locations on the PCMD depending on the arrangement of heat flux sensors within the device. Also, these heat flux values may be taken continuously over time, in order to observe heat flux variation as a function of time. Depending on which embodiment of the PCMD is used to determine a process condition for the workpiece processing tool, the method by which heat flux is measured may vary.

For a given heat flux sensor in the PCMD described in FIG. 1, a temperature is measured at the temperature sensor in the substrate component and an additional temperature is measured at the corresponding temperature sensor in the additional substrate component. The difference between these two temperature measurements is then compared against the known thermal resistance that sits between the two temperature sensors to determine heat flux perpendicular to the PCMD at the location of the heat flux sensor.

For a given heat flux sensor in the PCMD described in FIG. 2, the two temperature sensors must be close enough together such that the heat flux perpendicular to the PCMD does not vary between the locations of the two temperature sensors. A difference in measured temperature between the two temperature sensors during operation of the workpiece processing tool may then be determined. The difference may be attributed to the different thermal resistance values of the two thermally resistive cavities. This difference in measured temperature is then used to determine a heat flux value perpendicular to the PCMD.

For a given heat flux sensor in the PCMD described in FIG. 3, a temperature is measured at the first temperature sensor and an additional temperature is measured at the corresponding second temperature sensor. The difference between these two temperature measurements is then compared against the known thermal resistance that sits between the two temperature sensors to determine heat flux perpendicular to the PCMD at the location of the heat flux sensor. Here, a key parameter in determining the sensitivity of the PCMD is the thermal resistance in the area surrounding the sensors.

The heat flux values taken at different heat flux sensor locations within the PCMD may then be used as a proxy for determining a process condition of the workpiece processing tool as described at 507. By way of example, and not by way of limitation, in a plasma etch chamber ion energy and ion flux may be indirectly determined by calculating heat flux because ion energy and ion flux are believed to be substantially responsible as the source of heat flux in the plasma etch process. The varying of other "independent" etch tool parameters—such as pressure, flow, as well as physical and magnetic confinement parameters—are easily shown to affect ion energy and ion flux distributions, profiles and time dependencies. Measurement of temperature differences and calculation of heat flux—as described here—can serve to parameterize these effects as well.

Figure 6:
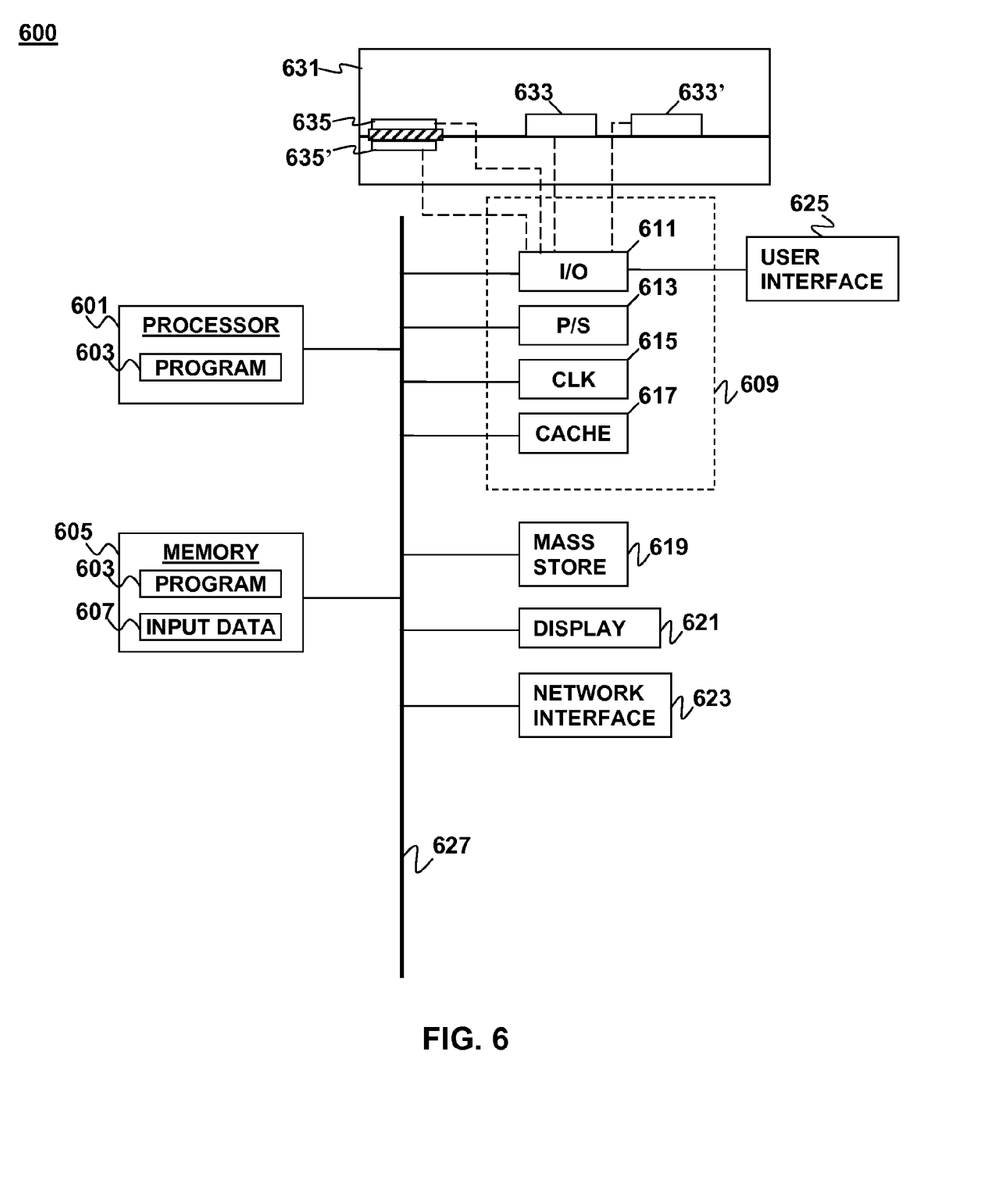
FIG. 6 is a block diagram illustrating an apparatus for determining process conditions of a workpiece processing tool according to an embodiment of the present invention.

FIG. 6 illustrates a block diagram of an apparatus that may be used to implement a method for determining process conditions in a workpiece processing tool configured to process production workpieces. The apparatus 600 generally may include a processor module 601 and a memory 605. The processor module 601 may include one or more processor cores.

The memory 605 may be in the form of an integrated circuit, e.g., RAM, DRAM, ROM, Flash, and the like. The memory 605 may also be a main memory that is accessible by all of the processor modules. In some embodiments, the processor module 601 may have local memories associated with each core. A program 603 may be stored in the main memory 605 in the form of processor readable instructions that can be executed on the processor modules. The program 603 may be configured to perform determination of process conditions in a workpiece processing tool configured to process production workpieces. The program 603 may be written in any suitable processor readable language, e.g., C, C++, JAVA, Assembly, MATLAB, FORTRAN, and a number of other languages. Input data 607 may also be stored in the memory. Such input data 607 may include measured temperatures of tandem aligned temperature sensors 635, 635' or parallel aligned temperature sensors 633, 633' located within a process condition measuring device (PCMD) 631. These measured temperatures will facilitate calculation of workpiece processing tool conditions as discussed above.

The apparatus 600 may also include well-known support functions 609, such as input/output (I/O) elements 611, power supplies (P/S) 613, a clock (CLK) 615, and a cache 617. The apparatus 600 may optionally include a mass storage device 619 such as a disk drive, CD-ROM drive, tape drive, or the like to store programs and/or data. The device 600 may optionally include a display unit 621 and user interface unit 625 to facilitation interaction between the apparatus and a user. The display unit 621 may be in the form of a cathode ray tube (CRT) or flat panel screen that displays text, numerals, graphical symbols or images. The user interface 625 may include a keyboard, mouse, joystick, light pen, or other device that may be used in conjunction with a graphical user interface (GUI). The apparatus 600 may also include a network interface 623 to enable the device to communicate with other devices over a network such as the internet.

The sensors 633, 633' 635, 635' on the PCMD 631 may be connected to the processor module 601 via the I/O elements 611. Such connections may be implemented by a transceiver (not shown) on the PCMD 631, e.g., as shown and described above with respect to FIG. 4, either wirelessly or through appropriate signal cables.

The components of the apparatus 600, including the processor 601, memory 605, support functions 609, I/O elements 611 mass storage device 619, user interface 625, network interface 623, and display unit 621 may be operably connected to each other via one or more data buses 627. These components may be implemented in hardware, software, firmware, or some combination of two or more of these.

Figure 7:
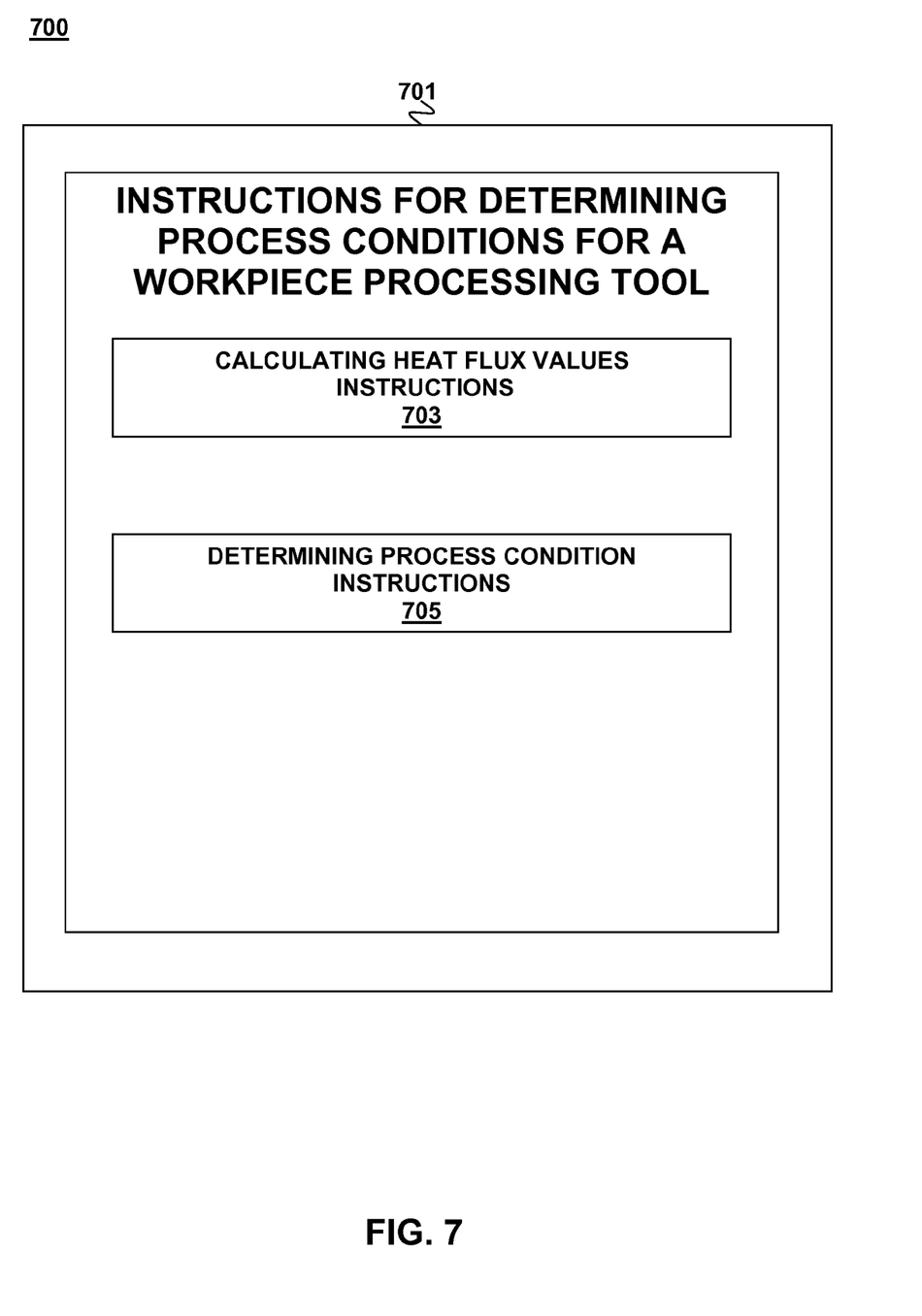
FIG. 7 illustrates an example of a non-transitory computer-readable storage medium with instructions for determining process conditions of a workpiece processing tool according to an embodiment of the present invention.

According to another embodiment, instructions for determining process conditions in a workpiece processing tool configured to process production workpieces may be stored in a computer readable storage medium. By way of example, and not by way of limitation, FIG. 7 illustrates an example of a non-transitory computer readable storage medium 700 in accordance with an embodiment of the present invention. The storage medium 700 contains computer-readable instructions stored in a format that can be retrieved, interpreted, and executed by a computer processing device. By way of example, and not by way of limitation, the computer-readable storage medium may be a computer-readable memory, such as random access memory (RAM) or read-only memory (ROM), a computer-readable storage disk for a fixed disk drive (e.g., a hard disk drive), or a removable disk drive. In addition, the computer-readable storage medium 700 may be a flash memory device, a computer-readable tape or disk, a CD-ROM, a DVD-ROM, or other optical storage medium.

The storage medium 700 contains instructions for determining processing conditions of a workpiece processing tool 701. The instructions for determining process conditions of a workpiece processing tool 701 may be configured to implement determination of process conditions in a workpiece processing tool configured to process production workpieces in accordance with the methods described above. In particular, the instructions for determining process conditions of a workpiece processing tool 701 may include calculating heat flux value instructions 703 that are used to calculate heat flux values perpendicular to a PCMD at each heat flux sensor location. Depending on the particular embodiment of the PCMD, different methods may be used to facilitate calculation of heat flux perpendicular to the PCMD. These methods were described above with respect to FIGS. 1A-1C, 2A-2B, and 3A-3B.

The instructions for determining process conditions of a workpiece processing tool 701 may also include determining process condition instructions 705 that are used to determine a desired process condition of a workpiece processing tool using the calculated heat flux values. As discussed above, depending on the particular workpiece tool and process in operation, different process parameters may be determined using heat flux as a proxy. The spatial variation and time variation of heat flux for a given PCMD will provide critical information for determining other process parameters of the workpiece processing tool during operation.

Accumulation of such data supplied by the PCMD heat flux sensors in their various embodiments will gradually supply sufficient information by which a "library" may be constructed and attendant correlations to other measured workpiece processing tool characteristics may be documented and exploited to evolve the effectiveness and utility of heat flux measurement as a proxy.

Embodiments of the present invention provide a tool for determining process conditions of workpiece processing tools. The ability to measure these quantities in a workpiece processing tool can provide additional insight into workpiece processing tool parameters. Embodiments of the present invention can help more easily identify key elements that affect workpiece processing tool performance and subsequently adjust the relevant parameter to optimize performance and controllability. Associated evolving development of the above-mentioned "library" will facilitate this accomplishment.

While the above is a complete description of the preferred embodiment of the present invention, it is possible to use various alternatives, modifications, and equivalents. Therefore, the scope of the present invention should be determined not with reference to the above description, but should, instead, be determined with reference to the appended claims along with their full scope of equivalents. Any feature described herein, whether preferred or not, may be combined with any other feature described herein, whether preferred or not. In the claims that follow, the indefinite article "A" or "An" refers to a quantity of one or more of the item following the article, except where expressly stated otherwise. Additionally, the conjunction "or" refers to the non-exclusive definition of "or" unless expressly stated otherwise. The appended claims are not to be interpreted as including means-plus-function limitations, unless such a limitation is explicitly received in a given claim using the phrase "means for".

The reader's attention is directed to all papers and documents which are filed concurrently with this specification and which are open to public inspection with this specification, and the contents of any papers and documents incorporated herein by reference.

What is claimed is:

1. A process condition measuring device (PCMD), comprising:
   a) a substrate component, an additional substrate component sandwiched together with the substrate component
   b) one or more heat flux sensors embedded between the substrate component and the additional substrate component, wherein the one or more heat flux sensors are configured to obtain heat flux values perpendicular to the PCMD; and
   c) a computer-readable media storing computer-executable instruction configured to determine process conditions in addition to a thermal condition in a workpiece processing tool by using the heat flux values as a proxy.

2. The PCMD of claim 1, wherein the substrate component or the additional substrate component is composed of the same material as the production workpiece.

3. The PCMD of claim 1, wherein either the substrate component or the additional substrate component is composed of silicon.

4. The PCMD of claim 1, wherein either the substrate component or the additional substrate component is composed of sapphire.

5. The PCMD of claim 1, wherein either the substrate component or the additional substrate component is composed of quartz.

6. The PCMD of claim 1, wherein either the substrate component or the additional substrate component is composed of glass.

7. The PCMD of claim 1, wherein either the first substrate component or the second substrate component is composed of silicon carbide.

8. The PCMD of claim 1, wherein each heat flux sensor includes two temperature sensors, a first temperature sensor being embedded within the substrate component and a second temperature sensor being embedded within the additional substrate component, the first and second temperature sensors being aligned in tandem, the one or more heat flux sensors being shielded from exposure to an environment within the workpiece processing tool by the substrate component or the additional substrate component during operation of the workpiece processing tool.

9. The PCMD of claim 1, further comprising a thermally resistive layer sandwiched between the substrate component and the additional substrate component.

10. The PCMD of claim 9, wherein the thermally resistive layer is made of a material with a lower thermal conductivity than both the first substrate component and the second substrate component.

11. The PCMD of claim 9, wherein the thermally resistive layer is composed of a dielectric material.

12. The PCMD of claim 9, wherein the thermally resistive layer is composed of polyimide.

13. The PCMD of claim 9, wherein the thermally resistive layer is composed of silicone.

14. The PCMD of claim 9, wherein the thermally resistive layer has a thickness between 5 µm and 1 mm.

15. The PCMD of claim 1, wherein the heat flux sensors are arranged in a configuration around the outer edge of the substrate component.

16. The PCMD of claim 1, wherein the heat flux sensors are arranged in a configuration around the center of the substrate component.

17. The PCMD of claim 1, wherein the heat flux sensors are embedded within the substrate component such that the heat flux sensors are shielded from exposure to an environment within the workpiece processing tool by the substrate component during operation of the workpiece processing tool.

18. The PCMD of claim 1, wherein each heat flux sensor includes two temperature sensors embedded within a thermally resistive cavity of the substrate component, the two temperature sensors being aligned in tandem with each other.

19. The PCMD of claim 18 wherein the thermally resistive cavity is characterized by a different thermal resistance than a remainder of the substrate component.

20. The PCMD of claim 1, wherein the PCMD has substantially similar dimensions to a production workpiece that is processed by the workpiece processing tool.

21. The PCMD of claim 1, wherein the substrate component is coated with an additional material to ensure compatibility with the workpiece processing tool.

22. The PCMD of claim 1, wherein the workpiece processing tool is a plasma etch chamber.

23. The PCMD of claim 1, further comprising a processor electronically coupled to the one or more heat flux sensors, wherein the processor is configured to process data captured by the one or more heat flux sensors.

24. The PCMD of claim 23, further comprising a memory coupled to the processor, the memory being configured to store data.

25. The PCMD of claim 23, further comprising a power source coupled to the processor.

26. The PCMD of claim 23, further comprising a transceiver coupled to the processor, the transceiver being configured to transmit or receive data to or from the processor.

27. A process condition measuring device (PCMD), comprising:
   a) a substrate component;
   b) one or more heat flux sensors embedded within the substrate component, wherein the one or more heat flux sensors are configured to obtain heat flux values perpendicular to the PCMD; and
   c) a computer readable media storing computer executable instruction configured to determine process conditions in addition to a thermal condition in a workpiece processing by using the heat flux values as a proxy, wherein each heat flux sensor includes two temperature sensors in close proximity, a first temperature sensor being embedded within a first thermally resistive cavity of the substrate component and a second temperature sensor being embedded within a second thermally resistive cavity of the substrate component, the first thermally resistive cavity having a different thermal resistance value than the second thermally resistive cavity, and the first temperature sensor and second temperature sensor being aligned in a parallel relationship configured to facilitate determination of heat flux perpendicular to the substrate through measurement of a temperature difference between the two temperature sensors.

28. The PCMD of claim 27, wherein the first thermally resistive cavity and the second thermally resistive cavity are different sizes.

29. The PCMD of claim 27, wherein the first thermally resistive cavity and the second thermally resistive cavity are composed of different materials.

30. The PCMD of claim 27 wherein the first or second thermally resistive cavity is characterized by a different thermal resistance than a remainder of the substrate component.

31. The PCMD of claim 27, wherein the PCMD has substantially similar dimensions to a production workpiece that is processed by the workpiece processing tool.

32. The PCMD of claim 27, wherein the substrate component is coated with an additional material to ensure compatibility with the workpiece processing tool.

33. The PCMD of claim 27, wherein the workpiece processing tool is a plasma etch chamber.

34. The PCMD of claim 27, further comprising a processor electronically coupled to the one or more heat flux sensors, wherein the processor is configured to process data captured by the one or more heat flux sensors.

35. The PCMD of claim 34, further comprising a memory coupled to the processor, the memory being configured to store data.

36. The PCMD of claim 35, further comprising a power source coupled to the processor.

37. The PCMD of claim 35 further comprising a transceiver coupled to the processor, the transceiver being configured to transmit or receive data to or from the processor.

38. A method, comprising:
   a) placing a processing condition measuring device (PCMD) in a workpiece processing tool, wherein the PCMD comprises a substrate component, an additional substrate component sandwiched together with the substrate component, and one or more heat flux sensors embedded between the substrate component and the additional substrate component;
   b) initiating operation of the workpiece processing tool;
   c) calculating one or more heat flux values perpendicular to the PCMD using the one or more heat flux sensors embedded in the PCMS; and
   d) determining a process condition of the workpiece processing tool other than a thermal condition using the one or more heat flux values determined in c) as a proxy for the process condition.

39. The method of claim 38, wherein the PCMD further comprises a thermally resistive layer sandwiched between the substrate component and the additional substrate component.

40. The method of claim 39, wherein each heat flux sensor includes two temperature sensors, a first temperature sensor being embedded within the substrate component and a second temperature sensor being embedded within the additional substrate component, the first and second temperature sensors being aligned in tandem, the one or more heat flux sensors being shielded from exposure to an environment within the workpiece processing tool by the substrate component or the additional substrate component during operation of the workpiece processing tool, the heat flux value for each heat flux sensor being determined by measuring a temperature difference between the first temperature sensor and second temperature sensor.

41. The method of claim 38, wherein each heat flux sensor includes two temperature sensors embedded within a thermally resistive cavity of the substrate component, the two temperature sensors being aligned in tandem with each other, the heat flux value for each heat flux sensor being determined by measuring a temperature difference between the first temperature sensor and the second temperature sensor across the thermally resistive cavity.

42. The method of claim 38, wherein the workpiece processing tool is a plasma etch chamber.

43. The method of claim 42, further comprising storing data supplied by the one or more heat flux sensors continuously over time and analyzing the stored data to observe attendant correlations to measured workpiece processing tool characteristics.

44. A method, comprising
   a) placing a processing condition measuring device (PCMD) in a workpiece processing tool, wherein the PCMD comprises a substrate component and one or more heat flux sensors embedded within the substrate component;
b) initiating operation of the workpiece processing tool;
c) calculating one or more heat flux values perpendicular to the PCMD using the one or more heat flux sensors embedded in the PCMD; and
d) determining a process condition of the workpiece processing tool other than a thermal condition using the one or more heat flux values determined in c) as a proxy for the process condition, wherein each heat flux sensor includes two temperature sensors in close proximity, a first temperature sensor being embedded within a first thermally resistive cavity of the substrate component and a second temperature sensor being embedded within a second thermally resistive cavity of the substrate component, the first thermally resistive cavity having a different thermal resistance value than the second thermally resistive cavity, and the first temperature sensor and second temperature sensor being aligned in a parallel relationship configured to facilitate determination of heat flux perpendicular to the substrate through measurement of a temperature difference between the two temperature sensors.

45. The method of claim 44, wherein calculating the one or more heat flux values includes comparing the difference between the first and second temperature sensors against known thermal resistance values of the first and second thermally resistive cavities.

46. The method of claim 44, wherein the first thermally resistive cavity and the second thermally resistive cavity are different sizes.

47. The method of claim 44, wherein the first thermally resistive cavity and the second thermally resistive cavity are composed of different materials.

48. The method of claim 44, wherein the workpiece processing tool is a plasma etch chamber.

49. The method of claim 48, further comprising storing data supplied by the one or more heat flux sensors continuously over time and analyzing the stored data to observe attendant correlations to measured workpiece processing tool characteristics.

50. A method, comprising
a) placing a processing condition measuring device (PCMD) in a workpiece processing tool, wherein the PCMD comprises a substrate component and one or more heat flux sensors embedded within the substrate component;
b) initiating operation of the workpiece processing tool;
c) calculating one or more heat flux values perpendicular to the PCMD using the one or more heat flux sensors embedded in the PCMD; and
d) determining a process condition of the workpiece processing tool other than a thermal condition using the one or more heat flux values determined in c) as a proxy for the process condition, wherein the process condition of the workpiece processing tool determined in d) is an ion flux to the PCMD, an ion energy of ions bombarding the PCMD, a pressure within a chamber that houses the PCMD, or a gas flow across the PCMD during operation of the workpiece processing tool, a source of energy at the surface of the PCMD resulting from ion and electron recombination or other energetic surface reaction, or a sink of deposited energy across the PCMD due to electrostatic clamping and active cooling.

51. An apparatus for determining process conditions in a workpiece processing tool, comprising:
a processor;
a memory; and
computer-coded instructions embodied in the memory and executable by the processor, wherein the computer coded instructions are configured to implement a method for determining process conditions in a workpiece processing tool configured to process production workpieces, the method comprising:
a) calculating one or more heat flux values perpendicular to a PCMD using a PCMD that comprises a substrate component and one or more heat flux sensors embedded within the substrate component;
b) determining a process condition in addition to thermal conditions of the workpiece processing tool using the one or more heat flux values determined in a) as a proxy, wherein the process condition of the workpiece processing tool determined in b) is an ion flux to the PCMD, an ion energy of ions bombarding the PCMD, a pressure within a chamber that houses the PCMD, or a gas flow across the PCMD during operation of the workpiece processing tool, a source of energy at the surface of the PCMD resulting from ion and electron recombination or other energetic surface reaction, or a sink of deposited energy across the PCMD due to electrostatic clamping and active cooling.

52. A computer program product, comprising:
a non-transitory, computer-readable storage medium having computer readable program code embodied in said medium for determining process conditions in a workpiece processing tool configured to process production workpieces, said computer program product having:
a) computer readable program code means for calculating one or more heat flux values perpendicular to a PCMD using a PCMD that comprises a substrate component and one or more heat flux sensors embedded within the substrate component;
b) computer readable program code means for determining a process condition in addition to thermal conditions of the workpiece processing tool using the one or more heat flux values determined in a) as a proxy, wherein the process condition of the workpiece processing tool determined in b) is an ion flux to the PCMD, an ion energy of ions bombarding the PCMD, a pressure within a chamber that houses the PCMD, or a gas flow across the PCMD during operation of the workpiece processing tool, a source of energy at the surface of the PCMD resulting from ion and electron recombination or other energetic surface reaction, or a sink of deposited energy across the PCMD due to electrostatic clamping and active cooling.

* * * * *